United States Patent
Yang et al.

(10) Patent No.: US 7,298,160 B2
(45) Date of Patent: Nov. 20, 2007

(54) METHOD OF MEASURING GATE CAPACITANCE BY CORRECTING DISSIPATION FACTOR ERROR

(75) Inventors: Gi-Young Yang, Suwon (KR); Yong-Un Jang, Gwacheon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 294 days.

(21) Appl. No.: 10/784,784

(22) Filed: Feb. 24, 2004

(65) Prior Publication Data

US 2004/0164761 A1    Aug. 26, 2004

(30) Foreign Application Priority Data

Feb. 26, 2003    (KR) ...................... 10-2003-0012040

(51) Int. Cl.
*G01R 31/26*    (2006.01)
*G01R 27/26*    (2006.01)
(52) U.S. Cl. ...................... 324/769; 324/659
(58) Field of Classification Search ................ 324/765, 324/769, 658, 659; 703/2, 14, 22
See application file for complete search history.

(56) References Cited

U.S. PATENT DOCUMENTS

| | | | | |
|---|---|---|---|---|
| 3,049,666 A | * | 8/1962 | Anderson | ................ 324/649 |
| 4,267,503 A | * | 5/1981 | Westra | ................ 324/659 |
| 6,069,485 A | * | 5/2000 | Long et al. | ................ 324/769 |
| 6,426,671 B1 | * | 7/2002 | Kono | ................ 327/541 |
| 6,560,567 B1 | * | 5/2003 | Yechuri | ................ 702/65 |

* cited by examiner

*Primary Examiner*—Jermele Hollington
(74) *Attorney, Agent, or Firm*—Volentine Francos & Whitt (57) ABSTRACT

A gate capacitance of a MOS transistor is determined by (a) measuring the gate capacitance and dissipation factor; (b) obtaining a channel resistance and a tunneling resistance; (c) setting an initial capacitance and an error dissipation factor; (d) calculating a direct dissipation factor using the channel resistance, the tunneling resistance, and the initial capacitance; (e) calculating a calculated dissipation factor using the error dissipation factor, the direct dissipation factor, and the measured dissipation factor; (f) calculating a calculated capacitance using the channel resistance, the tunneling resistance, the initial capacitance, the error dissipation factor, and the measured dissipation factor; and (g) detecting the initial capacitance as an accurate gate capacitance of the transistor if it is determined that the calculated capacitance is equal to the measured capacitance and the calculated dissipation factor is equal to the measured dissipation factor, and otherwise repeating steps (c) through (g).

12 Claims, 4 Drawing Sheets

METHOD OF MEASURING GATE CAPACITANCE BY CORRECTING DISSIPATION FACTOR ERROR

CROSS REFERENCES TO RELATED APPLICATIONS

This application claims priority under 35 U.S.C. §119 from Korean Patent Application No. 2003-12040, filed on Feb. 26, 2003, the contents of which are hereby incorporated by reference in their entirety as if fully set forth herein.

BACKGROUND AND SUMMARY

1. Technical Field

The present invention relates to a method of measuring a gate capacitance of a MOS transistor. Particularly, the present invention relates to a method of measuring an accurate gate capacitance by detecting a measurement error of an LCR meter used to analyze the characteristics of a MOS transistor.

2. Description of the Related Art

A MOS transistor operates on a principle that electric charges accumulate in a channel after passing through a gate oxide layer. Thus, to determine the characteristics of the MOS transistor, a method of measuring a gate capacitance has been widely used.

By measuring the gate capacitance, the amount of electric charge accumulated in the channel of the transistor and the thickness of the gate oxide layer can be obtained. For this reason, the gate capacitance is a critical value that requires precise measurement.

An LCR meter is an apparatus broadly used for measuring a gate capacitance of a MOS transistor. The LCR meter is used to measure parameters, such as a capacitance, an inductance, and a dissipation factor, with high accuracy in a short amount of time. Also, the LCR meter is used to easily measure contact resistances of electronic components, such as coils, condensers, and resistors.

However, the LCR meter cannot avoid a measurement error. In particular, as the gate oxide layer of a MOS transistor becomes thinner, the measurement error becomes larger.

Figure 1:
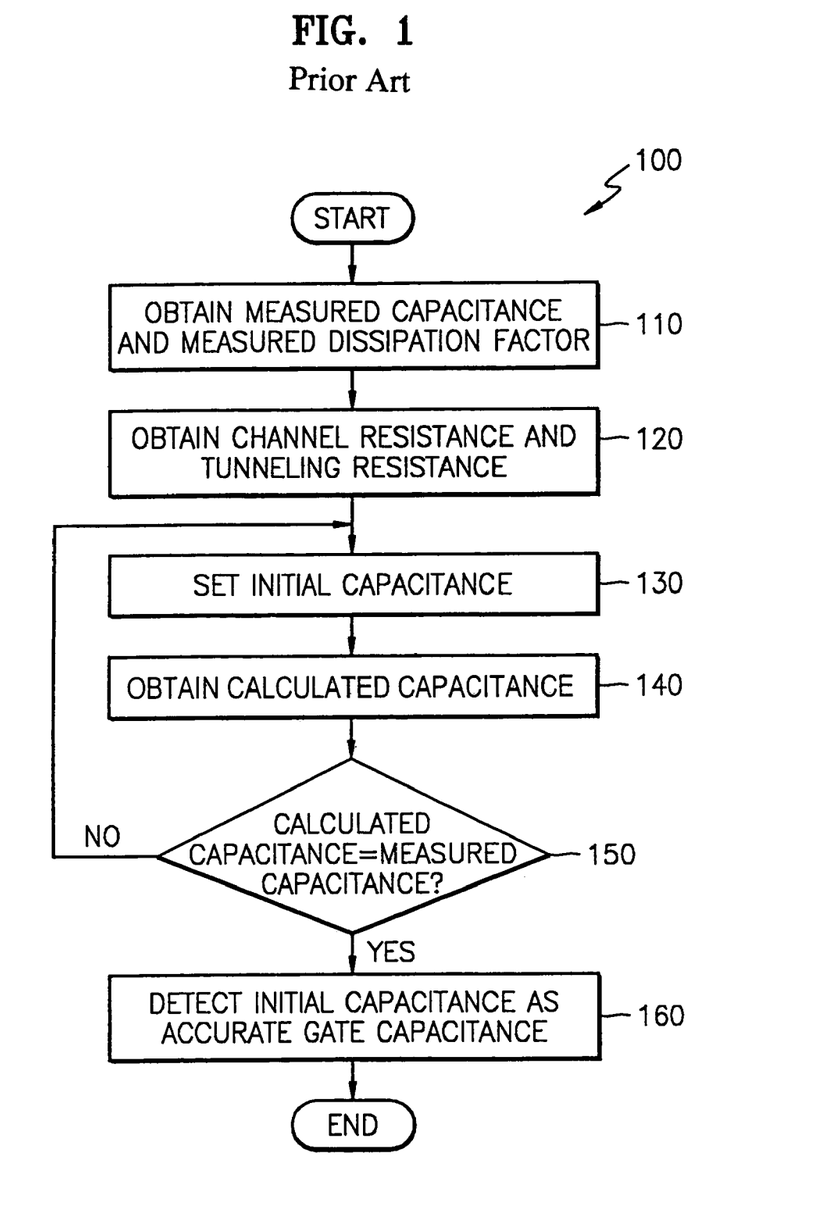
FIG. 1 is a flow chart illustrating a conventional method of measuring a gate capacitance.

FIG. 1 is a flow chart illustrating a conventional method of determining a gate capacitance of a MOS transistor.

Referring to FIG. 1, a measured capacitance and a measured dissipation factor are obtained (step 110). Here, the measured capacitance and the measured dissipation factor are measured using an LCR meter. Next, a channel resistance and a tunneling resistance are obtained (step 120). The channel resistance and the tunneling resistance are obtained using a measured direct current of the MOS transistor via the transistor's equations.

An initial capacitance is set and a calculated capacitance is obtained (steps 130 and 140). The initial capacitance is a parameter used for finding the calculated capacitance and is arbitrarily set by a designer. That is, the initial capacitance is arbitrarily set and the calculated capacitance is obtained using an equation. Then, it is determined whether or not the obtained calculated capacitance is equal to the measured capacitance obtained by the LCR meter (step 150).

If it is determined that the calculated capacitance is not equal to the measured capacitance, a new initial capacitance is set, and steps 140 and 150 are repeated. Steps 130 through 150 are repeated until the calculated capacitance is equal to the measured capacitance. If the calculated capacitance is equal to the measured capacitance, the then initial capacitance corresponds to an accurate gate capacitance. Therefore, the initial capacitance is detected as the accurate gate capacitance (step 160).

However, as described above, as the gate oxide layer of a MOS transistor becomes thinner, the measurement error of an LCR meter becomes larger. Thus, in step 110, the measured capacitance itself may have an error. As a result, the accurate gate capacitance, obtained by the conventional method 100 shown in FIG. 1, may have an error.

When the gate capacitance is measured using an LCR meter, the number of measurement errors is proportional to the dissipation factor. Thus, to precisely correct a measurement error of the gate capacitance, an error of the dissipation factor must be precisely compensated.

Therefore, it would be desirable to provide a method of measuring an accurate gate capacitance by correcting a measurement error of a gate capacitance measured by an LCR meter, by correcting an error in the dissipation factor.

SUMMARY OF THE INVENTION

In accordance with one aspect of the present invention, there is provided a method of measuring a gate capacitance of a MOS transistor, which comprises: (a) obtaining a measured capacitance and a measured dissipation factor by measuring the gate capacitance of the MOS transistor; (b) obtaining a channel resistance and a tunneling resistance of an equivalent circuit of the MOS transistor; (c) setting an initial capacitance and an error dissipation factor, which are required to find a calculated capacitance and a calculated dissipation factor, respectively; (d) calculating a direct dissipation factor using the channel resistance, the tunneling resistance, and the initial capacitance; (e) calculating the calculated dissipation factor using the error dissipation factor, the direct dissipation factor, and the measured dissipation factor; (f) calculating the calculated capacitance using the channel resistance, the tunneling resistance, the initial capacitance, the error dissipation factor, and the measured dissipation factor; and (g) detecting the initial capacitance as an accurate gate capacitance of the MOS transistor if it is determined that the calculated capacitance is equal to the measured capacitance and the calculated dissipation factor is equal to the measured dissipation factor, and repeating step (c) through step (g) if the calculated capacitance is not equal to the measured capacitance or if the calculated dissipation factor is not equal to the measured dissipation factor.

Beneficially, step (b) comprises: (b1) measuring a direct gate current, a direct drain current, a direct gate voltage, and a direct drain voltage of the MOS transistor; and (b2) obtaining the channel resistance and the tunneling resistance using the direct gate current, the direct drain current, the direct gate voltage, and the direct drain voltage.

The tunneling resistance is calculated by $$R_t = L \left[ \frac{Z_{dc}}{Y_{dc}} (Z_{dc} \cdot Y_{dc} + 2) \right]^{1/2} \bigg/ \cosh^{-1}(Z_{dc} \cdot Y_{dc} + 2),$$

and the channel resistance is calculated by $$R_s = \frac{1}{R_t} \left[ \frac{Z_{dc}}{Y_{dc}} \cdot 4 \cdot (Z_{dc} \cdot Y_{dc} + 2) \right].$$

Here, $Z_{dc}$ is a drain impedance that is obtained by dividing the direct drain voltage by the direct drain current, and $Y_{dc}$ is a gate admittance that is obtained by dividing the direct gate current by the direct gate voltage.

The error dissipation factor is obtained by subtracting the measured dissipation factor from the direct dissipation factor.

The direct dissipation factor is calculated by $$D_{dc} = \frac{A\sinh(L \cdot Y \cdot A) - B\sin(L \cdot Y \cdot B)}{A\sin(L \cdot Y \cdot B) + B\sinh(L \cdot Y \cdot A)}.$$

Here, A is obtained by $$A = \sqrt{\sqrt{1+(\omega c_i \cdot R_t)^2} \cdot \cos\left(\frac{\tan^{-1}\omega c_i \cdot R_t}{2}\right)};$$

B is obtained by $$B = \sqrt{\sqrt{1+(\omega c_i + R_t)^2} \cdot \sin\left(\frac{\tan^{-1}\omega c_i \cdot R_t}{2}\right)};$$

Y is obtained by $$Y = \sqrt{\frac{R_s}{R_t}};$$

and L denotes a length of the MOS transistor.

The calculated dissipation factor is calculated by $D_m = D_{dc} \cdot (1 - D_{err}(1+D_m))$. The calculated capacitance is calculated by $C_m = C_{m1} \cdot (1 - D_{err}/100 \cdot \sqrt{(1+D_m^2)})$; $C_{m1}$ is calculated by $$Y_{ac} = 2 \cdot \frac{\tanh\left(\gamma \cdot \frac{L}{2}\right)}{Z_O} = R' + jwC_{m1};$$

where R' is a real number; $Y_{ac}$ represents a gate input admittance of the MOS transistor, γ is calculated by $$\gamma = \sqrt{\frac{R_s}{R_t} + jwC_i \cdot R_s};$$

and $Z_o$ is calculated by $$Z_O = \sqrt{\frac{R_s \cdot R_t}{1 + jwC_i \cdot R_t}}.$$

BRIEF DESCRIPTION OF THE DRAWINGS

The above features and advantages of the present invention will become more apparent by describing in detail exemplary embodiments thereof with reference to the attached drawings in which.

DETAILED DESCRIPTION

The present invention will now be described more fully with reference to the accompanying drawings, in which preferred embodiments of the invention are shown. The same reference numerals in different drawings represent the same element.

Figure 2:
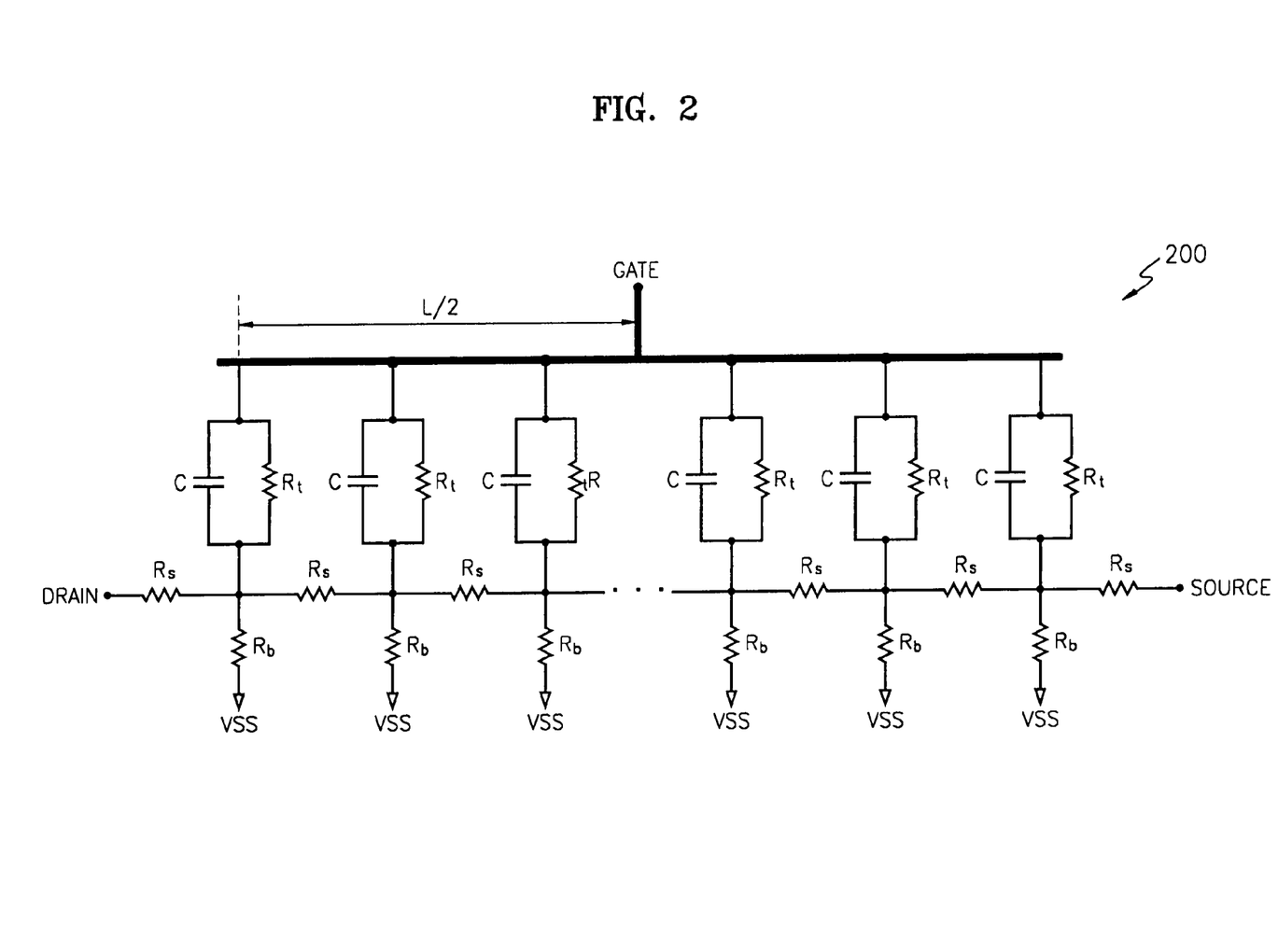
FIG. 2 is an equivalent circuit diagram modeling a channel region of a MOS transistor.

FIG. 2 is an equivalent circuit modelling a channel region of a MOS transistor.

A plurality of capacitors C and a plurality of tunnelling resistors $R_t$ are respectively connected in parallel to a gate. A plurality of channel resistors $R_s$ are connected in a series between a drain and a source. The capacitors C are gate capacitors.

Figure 3:
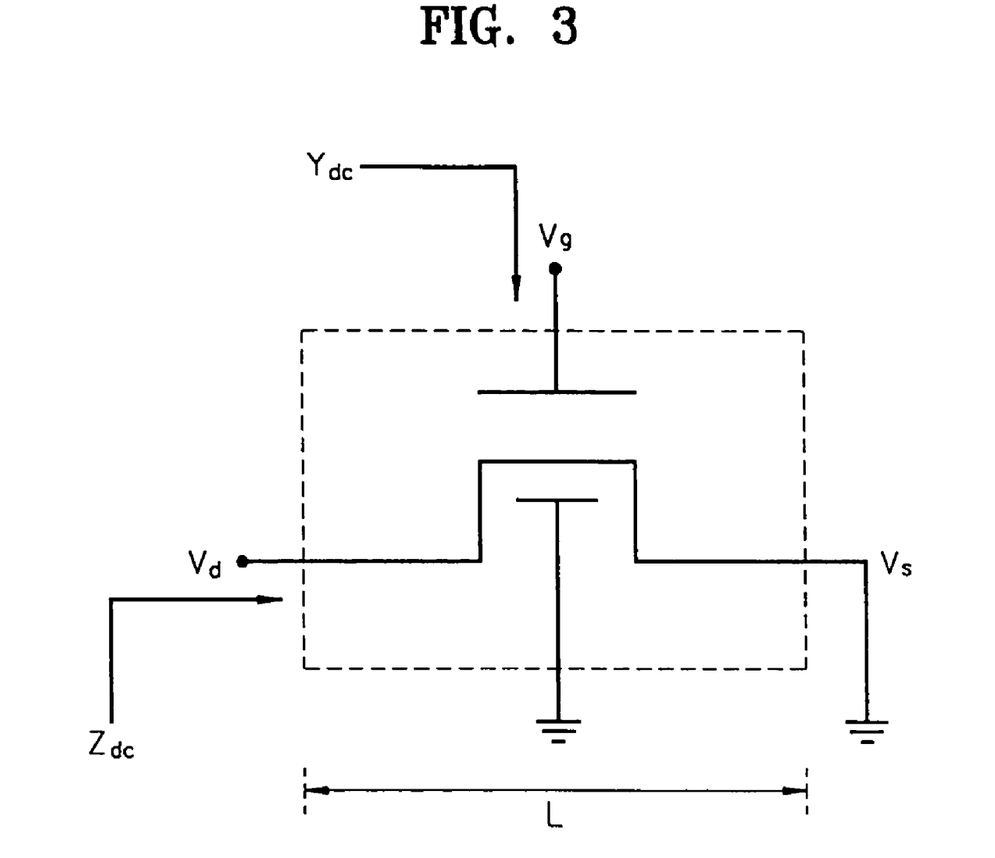
FIG. 3 is a circuit diagram modeling a MOS transistor to obtain an impedance and an admittance.

FIG. 3 is a circuit diagram modelling a MOS transistor to obtain an impedance and an admittance.

Reference character L denotes a length of the MOS transistor. $Z_{dc}$ is a drain impedance that is obtained by dividing a direct drain voltage by a drain current, and $Y_{dc}$ is a gate admittance that is obtained by dividing a direct gate current by a direct gate voltage.

The drain impedance $Z_{dc}$ and the gate admittance $Y_{dc}$ are used to obtain a value of the tunnelling resistor $R_t$ (i.e., a tunnelling resistance) of FIG. 2 and a value of the channel resistor $R_s$ (i.e., a channel resistance) of FIG. 2. A method of calculating the tunnelling resistance and the channel resistance using the drain impedance $Z_{dc}$ and the gate admittance $Y_{dc}$ will be described later.

Figure 4:
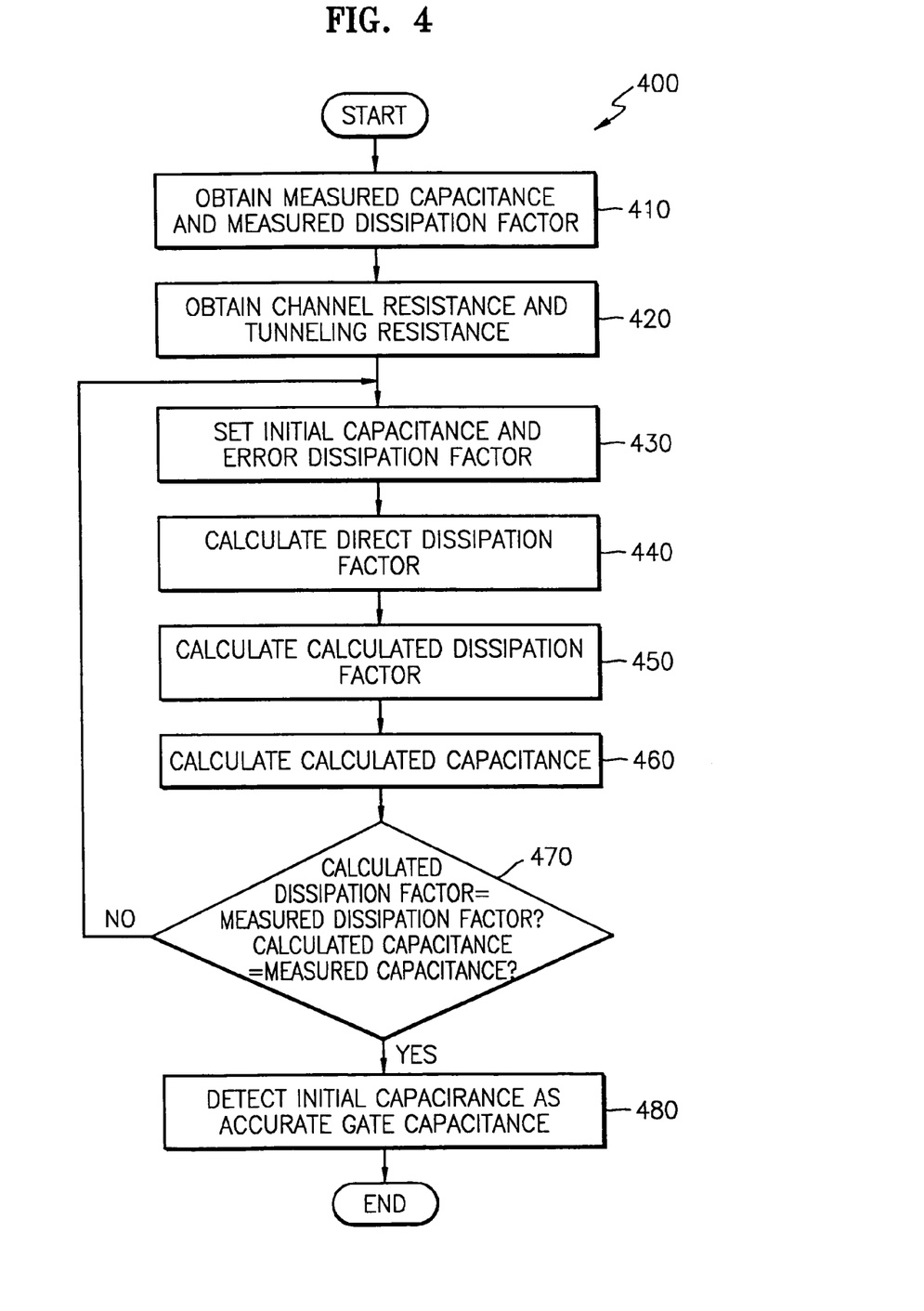
FIG. 4 is a flow chart illustrating a method of measuring a gate capacitance according to one or more aspects of the present invention.

FIG. 4 is a flow chart illustrating a method of measuring a gate capacitance.

Referring to FIG. 4, the method 400 of measuring a gate capacitance comprises, initially, obtaining a measured capacitance and a measured dissipation factor by measuring a gate capacitance of a MOS transistor (step 410).

Next, a channel resistance and a tunnelling resistance of an equivalent circuit of the MOS transistor are obtained (step 420). More specifically, step 420 includes: (1) measuring a direct gate current, a direct drain current, a direct gate voltage, and a direct drain voltage of the MOS transistor; and (2) obtaining the channel resistance and the tunnelling resistance using the direct gate current, the direct drain current, the direct gate voltage, and the direct drain voltage.

An initial capacitance and an error dissipation factor are set to obtain a calculated capacitance and a calculated dissipation factor, respectively (step 430). A direct dissipation factor is calculated using the tunnelling resistance and the initial capacitance (step 440).

The calculated dissipation factor is calculated using the error dissipation factor, the direct dissipation, and the measured dissipation factor (step 450). Then, the calculated capacitance is calculated using the channel resistance, the tunnelling resistance, the initial capacitance, the error dissipation factor, and the measured dissipation factor (step 460).

Then, it is determined whether or not the calculated capacitance is equal to the measured capacitance and whether or not the calculated dissipation factor is equal to the measured dissipation factor (step 470). If it is determined that the calculated capacitance is equal to the measured capacitance and the calculated dissipation factor is equal to the measured dissipation factor, the initial capacitance is detected as an accurate gate capacitance of the MOS transistor (step 480). If it is determined that the calculated capacitance is not equal to the measured capacitance or that the calculated dissipation factor is not equal to the measured dissipation factor, step 430 through step 470 are performed again.

Hereinafter, a method of measuring a gate capacitance will be described with reference to FIGS. 2 through 4 in greater detail.

A measured capacitance and a measured dissipation factor are obtained by measuring a gate capacitance of a MOS transistor (step 410). Hereinafter, the measured capacitance will be denoted by $C_m$ and the measured dissipation factor will be denoted by $D_m$. As in the conventional method (100 of FIG. 1), the measured capacitance $C_m$ and the measured dissipation factor $D_m$ are measured using an LCR meter.

Next, a channel resistance and a tunnelling resistance of an equivalent circuit 200 of the MOS transistor are obtained (step 420). To obtain the channel resistance and the tunnelling resistance, a direct current of the MOS transistor is measured using a direct current measuring apparatus (not shown).

FIG. 3 shows a process of measuring the direct current. That is, a direct gate current, a direct drain current, a direct gate voltage, and a direct drain voltage of the MOS transistor are measured using the direct current measuring apparatus. Also, a drain impedance and a gate admittance are obtained using the direct gate current, the direct drain current, the direct gate voltage, and the direct drain voltage.

Hereinafter, the drain impedance will be denoted by $Z_{dc}$ and the gate admittance will be denoted by $Y_{dc}$. The direct gate current will be denoted by $I_g$, the direct drain current will be denoted by $I_d$, the direct gate voltage will be denoted by $V_g$, and the direct drain voltage will be denoted by $V_d$. The drain impedance $Z_{dc}$ is obtained by dividing the direct drain voltage $V_d$ by the direct drain current $I_d$. That is, $Z_{dc}=V_d/I_d$.

The gate admittance $Y_{dc}$ is obtained by dividing the direct gate current $I_g$ by the direct gate voltage $V_g$. That is, $Y_{dc}=I_g/V_g$.

Then, the tunnelling resistance can be obtained using the following Equation 1.

$$R_t = L \left[ \frac{Z_{dc}}{Y_{dc}} (Z_{dc} \cdot Y_{dc} + 2) \right]^{1/2} \bigg/ \cosh^{-1}(Z_{dc} \cdot Y_{dc} + 2) \tag{1}$$

Also, the channel resistance is obtained using the following Equation 2.

$$R_s = \frac{1}{R_t} \left[ \frac{Z_{dc}}{Y_{dc}} \cdot 4 \cdot (Z_{dc} \cdot Y_{dc} + 2) \right] \tag{2}$$

Equations 1 and 2 for finding the tunnelling resistance and the channel resistance are obtained from the equivalent circuit 200 of the MOS transistor shown in FIG. 2.

An initial capacitance for finding a calculated capacitance and an error dissipation factor for finding a calculated dissipation factor are set (step 430). While only the initial capacitance is set in the conventional method (100 of FIG. 1), both the initial capacitance and the error dissipation factor are set in the method 400. Herein, the initial capacitance is denoted by $C_i$ and the error dissipation factor is denoted by $D_{err}$.

The initial capacitance $C_i$ is arbitrarily set by a designer. The error dissipation factor $D_{err}$ is obtained by subtracting the measured dissipation factor $D_m$ from the direct dissipation factor. The measured dissipation factor $D_m$ is measured using the LCR meter in step 410. Hereinafter, the direct dissipation factor will be denoted by $D_{dc}$.

The direct dissipation factor $D_{dc}$ can be obtained from the following Equation 3 using the channel resistance, the tunnelling resistance, and the initial capacitance $C_i$ (step 440).

$$D_{dc} = \frac{A\sinh(L \cdot Y \cdot A) - B\sin(L \cdot Y \cdot B)}{A\sin(L \cdot Y \cdot B) + B\sinh(L \cdot Y \cdot A)} \tag{3}$$

Here, $A = \sqrt{\sqrt{1+(\omega c_i + R_t)^2} \cdot \cos\left(\frac{\tan^{-1}\omega c_i \cdot R_t}{2}\right)}$, $B = \sqrt{\sqrt{1+(\omega c_i + R_t)^2} \cdot \sin\left(\frac{\tan^{-1}\omega c_i \cdot R_t}{2}\right)}$, $Y = \sqrt{\frac{R_s}{R_t}}$, and L is a length of the MOS transistor.

Equation 3 for finding the direct dissipation factor $D_{dc}$ is obtained from the equivalent circuit 200 of the MOS transistor shown in FIG. 2. The direct dissipation factor $D_{dc}$ is an accurate value with no measurement error.

The calculated dissipation factor is calculated using the error dissipation factor, the direct dissipation factor, and the measured dissipation factor (step 450). Hereinafter, the calculated dissipation factor will be denoted by $D_{m'}$.

The calculated dissipation factor $D_{m'}$ is obtained using the following Equation 4.

$$D_{m'} = D_{dc} \cdot (1 - D_{err}(1+D_m)) \tag{4}$$

Equation 4 for finding the calculated dissipation factor $D_{m'}$ can be obtained from a data sheet of the LCR meter.

The calculated capacitance is obtained using the channel resistance, the tunnelling resistance, the initial capacitance $C_i$, the error dissipation factor $D_{err}$, and the measured dissipation factor $D_m$ (step 460). Hereinafter, the calculated capacitance is denoted by $C_{m'}$.

The calculated capacitance $C_{m'}$ can be obtained using the following Equation 5.

$$C_{m'} = C_{m1} \cdot (1 - D_{err}/100 \cdot \sqrt{(1+D_m^2)}) \tag{5}$$

Equation 5 for finding the calculated capacitance $C_{m'}$ can be obtained from the data sheet of the LCR meter. $C_{m1}$ in Equation 5 is obtained using the following Equation 6.

$$Y_{ac} = 2 \cdot \frac{\tanh\left(\gamma \cdot \frac{L}{2}\right)}{Z_o} = R' + jwC_{m1}, \tag{6}$$

where R' is a real number $Y_{ac}$ is a gate input admittance of the MOS transistor, and Equation 5 is obtained from the transmission line theory. That is, the gate input admittance of the equivalent circuit 200 as shown in FIG. 2 is obtained in a complex number form as: R'+jwC$_{m1}$. Thus, C$_{m1}$ can be obtained.

Then, γ is calculated by $$\gamma = \sqrt{\frac{R_s}{R_t} + jwC_i \cdot R_s},$$

and $Z_o$ is calculated by $$Z_o = \sqrt{\frac{R_s \cdot R_t}{1 + jwC_i \cdot R_t}}.$$

It is determined whether or not the calculated capacitance $C_{m'}$ is equal to the measured capacitance and whether or not the calculated dissipation factor $D_{m'}$ is equal to the measured dissipation factor $D_m$ (step 470).

In the conventional method 100, it is determined only whether or not the calculated capacitance is equal to the measured capacitance. If the measured capacitance contains an error, the gate capacitance obtained from the calculated capacitance also contains an error.

On the other hand, in the method 400, as an error contained in the calculated dissipation factor $D_{m'}$ is corrected using the error dissipation factor $D_{err}$, an error contained in the calculated capacitance $C_{m'}$ can also be corrected.

If it is determined that the calculated capacitance $C_{m'}$ is not equal to the measured capacitance $C_m$ or the calculated dissipation factor $D_{m'}$ is not equal to the measured dissipation factor $D_m$, step 430 through step 470 are performed again.

If the calculated capacitance $C_{m'}$ is not equal to the measured capacitance $C_m$ or if the calculated dissipation factor $D_{m'}$ is not equal to the measured dissipation factor $D_m$, the initial capacitance $C_i$ and the error dissipation factor $D_{err}$ are newly set. As the initial capacitance $C_i$ is set again, the direct dissipation factor $D_{dc}$ is varied and thus the error dissipation factor $D_{err}$ is also varied.

If the error dissipation factor $D_{err}$ and the direct dissipation factor $D_{dc}$ are varied, the calculated dissipation factor $D_{m'}$ is also varied. As the error dissipation factor $D_{err}$ is varied, the calculated capacitance $C_{m'}$ is also varied. Thus, it is determined whether or not the varied calculated dissipation factor $D_{m'}$ is equal to the measured dissipation factor $D_m$. Also, it is determined whether or not the varied calculated capacitance $C_{m'}$ is equal to the measured capacitance $C_m$.

If it is determined that the varied calculated dissipation factor $D_{m'}$ is not equal to the measured dissipation factor $D_m$ or the varied calculated capacitance $C_{m'}$ is not equal to the measured capacitance $C_m$, the initial capacitance $C_i$ and the error dissipation factor $D_{err}$ are newly set again, and step 440 through step 470 are performed again.

As described above, a process of optimizing the initial capacitance $C_i$ and the error dissipation factor $D_{err}$ is repeated until the calculated dissipation factor $D_{m'}$ is equal to the measured dissipation factor $D_m$. Thus, the error contained in the measured dissipation factor $D_m$ can be corrected.

Also, while the error dissipation factor $D_{err}$ is being compensated, the error contained in the measured capacitance is also corrected. Accordingly, if the calculated capacitance $C_{m'}$ is equal to the measured capacitance $C_m$, the then initial capacitance $C_i$ is detected as an accurate gate capacitance of the MOS transistor (step 480).

That is, according to the method 400, when the error contained in the measured dissipation factor $D_m$ is corrected using the error dissipation factor $D_{err}$ and the calculated dissipation factor $D_{m'}$, the error contained in the measured capacitance $C_m$ is also corrected. Thus, it is possible to obtain an accurate gate capacitance of the MOS transistor.

As explained thus far, an error in the measured dissipation factor can be corrected by use of an LCR meter, thus enabling correct measurement of a gate capacitance of a MOS transistor.

In the drawings and specification, there has been disclosed a typical preferred embodiment of the invention and, although, specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of determining a gate capacitance of a MOS transistor, the method comprising:
    (a) obtaining a measured capacitance and a measured dissipation factor by measuring the gate capacitance of the MOS transistor;
    (b) obtaining a channel resistance and a tunneling resistance of an equivalent circuit of the MOS transistor;
    (c) setting an initial capacitance and an error dissipation factor, which are required to find a calculated capacitance and a calculated dissipation factor, respectively;
    (d) calculating a direct dissipation factor using the channel resistance, the tunneling resistance, and the initial capacitance;
    (e) calculating the calculated dissipation factor using the error dissipation factor, the direct dissipation factor, and the measured dissipation factor;
    (f) calculating the calculated capacitance using the channel resistance, the tunneling resistance, the initial capacitance, the error dissipation factor, and the measured dissipation factor;
    (g) detecting the initial capacitance as an accurate gate capacitance of the MOS transistor when it is determined that the calculated capacitance is equal to the measured capacitance and the calculated dissipation factor is equal to the measured dissipation factor; and
    (h) repeating steps (c) through (g) when at least one of the following conditions is true:
        (1) the calculated capacitance is not equal to the measured capacitance, and
        (2) the calculated dissipation factor is not equal to the measured dissipation factor.

2. The method of claim 1, wherein step (b) comprises:
    (b1) measuring a direct gate current, a direct drain current, a direct gate voltage, and a direct drain voltage of the MOS transistor; and (b2) obtaining the channel resistance and the tunneling resistance using the direct gate current, the direct drain current, the direct gate voltage, and the direct drain voltage.

3. The method of claim 2, wherein the tunneling resistance is calculated by $$R_t = L\left[\frac{Z_{dc}}{Y_{dc}}(Z_{dc} \cdot Y_{dc} + 2)\right]^{1/2} / \cosh^{-1}(Z_{dc} \cdot Y_{dc} + 2),$$

and the channel resistance is calculated by $$R_s = \frac{1}{R_t}\left[\frac{Z_{dc}}{Y_{dc}} \cdot 4 \cdot (Z_{dc} \cdot Y_{dc} + 2)\right],$$

wherein $Z_{dc}$ is a drain impedance obtained by dividing the direct drain voltage by the direct drain current, $Y_{dc}$ is a gate admittance obtained by dividing the direct gate current by the direct gate voltage, and L is a length of the MOS transistor.

4. The method of claim 1, wherein the error dissipation factor is obtained by subtracting the measured dissipation factor from the direct dissipation factor.

5. The method of claim 1, wherein the direct dissipation factor is calculated by $$D_{dc} = \frac{A\sinh(L \cdot Y \cdot A) - B\sin(L \cdot Y \cdot B)}{A\sin(L \cdot Y \cdot B) + B\sinh(L \cdot Y \cdot A)},$$

wherein A is obtained by $$A = \sqrt{\sqrt{1 + (\omega c_i + R_t)^2} \cdot \cos\left(\frac{\tan^{-1}\omega c_i \cdot R_t}{2}\right)},$$

B is obtained by $$B = \sqrt{\sqrt{1 + (\omega c_i + R_t)^2} \cdot \sin\left(\frac{\tan^{-1}\omega c_i \cdot R_t}{2}\right)},$$

Y is obtained by $$Y = \sqrt{\frac{R_s}{R_t}},$$

L is a length of the MOS transistor, $R_s$ is the channel resistance, $R_t$ is the tunneling resistance, and $c_i$ is the initial capacitance.

6. The method of claim 1, wherein the calculated dissipation factor is calculated by $D_m = D_{dc} \cdot (1 - D_{err}(1 + D_m))$, wherein $D_{dc}$ is the direct dissipation factor, $D_m$ is the measured dissipation factor, and $D_{err}$ is the error dissipation factor.

7. The method of claim 1, wherein the calculated capacitance is calculated by $C_m = C_{m1} \cdot (1 - D_{err}/100 \cdot \sqrt{(1 + D_m^2)})$, wherein $D_{err}$ is the error dissipation factor, $D_m$ is the measured dissipation factor, and wherein $C_{m1}$ is calculated by $$Y_{ac} = 2 \cdot \frac{\tanh\left(\gamma \cdot \frac{L}{2}\right)}{Z_O} = R' + jwC_{m1},$$

where R' is a real number; L is a length of the MOS transistor, $Y_{ac}$ denotes a gate input admittance of the MOS transistor, $\gamma$ is calculated by $$\gamma = \sqrt{\frac{R_s}{R_t} + jwC_i \cdot R_s},$$

and $Z_o$ is calculated by $$Z_O = \sqrt{\frac{R_s \cdot R_t}{1 + jwC_i \cdot R_t}},$$

where $R_s$ is the channel resistance, $R_t$ is the tunneling resistance, and $C_i$ is the initial capacitance.

8. A method of determining a gate capacitance of a MOS transistor, comprising:

(a) measuring a measured capacitance and a measured dissipation factor of the MOS transistor;

(b) setting an initial capacitance;

(c) calculating a calculated capacitance and a calculated dissipation factor based on the initial capacitance;

(d) repeating steps (b) and (c) until both the calculated capacitance is equal to the measured capacitance and the calculated dissipation factor is equal to the measured dissipation factor; and (e) detecting the initial capacitance as an accurate gate capacitance of the MOS transistor when it is determined that both the calculated capacitance is equal to the measured capacitance and the calculated dissipation factor is equal to the measured dissipation factor.

9. The method of claim 8, further comprising, prior to step (c):

measuring a direct gate current, a direct drain current, a direct gate voltage, and a direct drain voltage of the MOS transistor; and obtaining a channel resistance and a tunneling resistance of the MOS transistor using the direct gate current, the direct drain current, the direct gate voltage, and the direct drain voltage, wherein the calculated dissipation factor is calculated in step (c) based upon the channel resistance and the tunneling resistance.

10. The method of claim 9, wherein the tunneling resistance is calculated by $$R_t = L\left[\frac{Z_{dc}}{Y_{dc}}(Z_{dc} \cdot Y_{dc} + 2)\right]^{1/2} / \cosh^{-1}(Z_{dc} \cdot Y_{dc} + 2),$$

and the channel resistance is calculated by $$R_s = \frac{1}{R_t}\left[\frac{Z_{dc}}{Y_{dc}} \cdot 4 \cdot (Z_{dc} \cdot Y_{dc} + 2)\right],$$

wherein $Z_{dc}$ is a drain impedance obtained by dividing the direct drain voltage by the direct drain current, $Y_{dc}$ is a gate admittance obtained by dividing the direct gate current by the direct gate voltage, and L is a length of the MOS transistor.

11. The method of claim 10, wherein the calculated capacitance is calculated by $C_m = C_{m1} \cdot (1 - D_{err}/100 \cdot \sqrt{(1+D_m^2)})$, wherein $D_{err}$ is an error dissipation factor, and $D_m$ is the measured dissipation factor, wherein $C_{m1}$ is calculated by $$Y_{ac} = 2 \cdot \frac{\tanh\left(\gamma \cdot \frac{L}{2}\right)}{Z_O} = R' + jwC_{m1},$$

where R' is a real number; L is a length of the MOS transistor, $Y_{ac}$ denotes a gate input admittance of the MOS transistor, $\gamma$ is calculated by $$\gamma = \sqrt{\frac{R_s}{R_t} + jwC_i \cdot R_s},$$

and $Z_o$ is calculated by $$Z_O = \sqrt{\frac{R_s \cdot R_t}{1 + jwC_i \cdot R_t}},$$

where $R_s$ is the channel resistance, $R_t$ is the tunneling resistance, and $C_i$ is the initial capacitance.

12. The method of claim 8, wherein the calculated dissipation factor is calculated by $D_m = D_{dc} \cdot (1 + D_{err}(1 + D_m))$, wherein $D_{dc}$ is a direct dissipation factor, $D_m$ is the measured dissipation factor, and $D_{err}$ is an error dissipation factor, wherein the direct dissipation factor is calculated by $$D_{dc} = \frac{A\sinh(L \cdot Y \cdot A) - B\sin(L \cdot Y \cdot B)}{A\sin(L \cdot Y \cdot B) + B\sinh(L \cdot Y \cdot A)},$$

wherein A is obtained by $$A = \sqrt{\sqrt{1 + (\omega c_i \cdot R_t)^2} \cdot \cos\left(\frac{\tan^{-1}\omega c_i \cdot R_t}{2}\right)};$$

B is obtained by $$B = \sqrt{\sqrt{1 + (\omega c_i \cdot R_t)^2} \cdot \sin\left(\frac{\tan^{-1}\omega c_i \cdot R_t}{2}\right)};$$

Y is obtained by $$Y = \sqrt{\frac{R_s}{R_t}},$$

L is a length of the MOS transistor, $R_s$ is a channel resistance, $R_t$ is a tunneling resistance, and $c_i$ is the initial capacitance, and wherein the error dissipation factor is obtained by subtracting the measured dissipation factor from the direct dissipation factor.

* * * * *